(12) United States Patent
Reynov et al.

(10) Patent No.: US 8,952,260 B1
(45) Date of Patent: Feb. 10, 2015

(54) CIRCUIT BOARDS DEFINING REGIONS FOR CONTROLLING A DIELECTRIC CONSTANT OF A DIELECTRIC MATERIAL

(75) Inventors: Boris Reynov, Cupertino, CA (US); Shreeram Siddhaye, Sunnyvale, CA (US); Venkata Penmetsa, Cupertino, CA (US); John Cleveland, Cupertino, CA (US); Madhavi Rajan, Fremont, CA (US); John Tran, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 391 days.

(21) Appl. No.: 13/434,386

(22) Filed: Mar. 29, 2012

(51) Int. Cl.
| | | |
|---|---|---|
| *H05K 1/00* | (2006.01) | |
| *H01K 3/10* | (2006.01) | |
| *H05K 1/02* | (2006.01) | |
| *H05K 3/30* | (2006.01) | |

(52) U.S. Cl.
CPC ............... *H05K 1/0216* (2013.01); *H05K 3/30* (2013.01)
USPC .............................. 174/258; 174/262; 29/852

(58) Field of Classification Search
CPC ..................................................... H05K 1/204
USPC .......... 174/255, 257, 262–266; 361/792–795; 29/852–853
See application file for complete search history.

(56) References Cited

U.S. PATENT DOCUMENTS

| | | | |
|---|---|---|---|
| 3,961,228 A | | 6/1976 | Briggs et al. |
| 5,263,868 A | | 11/1993 | Renn et al. |
| 5,917,149 A | | 6/1999 | Barcley et al. |
| 5,981,869 A | * | 11/1999 | Kroger .......................... 174/388 |
| 6,594,152 B2 | | 7/2003 | Dent |
| 6,700,463 B2 | * | 3/2004 | Killen et al. .................. 333/238 |
| 7,634,193 B2 | | 12/2009 | Lang et al. |

OTHER PUBLICATIONS

Lee W. Ritchey, "A Survey and Tutorial of Dielectric Materials Used in the Manufacture of Printed Circuit Boards" Copyright held by Lee Ritchey of speeding edge, Sep. 1999, presented at PCB Design Conference west in Mar. 1999, pp. 1-10.
Altium "Interactive and Differential Pair Routing" AP0135 (v1.5) Jan. 7, 2008, pp. 1-27.

* cited by examiner

*Primary Examiner* — Jeremy C Norris
(74) *Attorney, Agent, or Firm* — Cooley LLP

(57) ABSTRACT

In some embodiments, a printed circuit board, configured to be coupled to electronic components, includes a first material portion and any number of second material portions. Each second material portion is sized and spaced apart from an adjacent second material portion such that electromagnetic waves associated with the operation of the electronic components are substantially not reflected. The first material portion defines a first dielectric constant and the second material portion defines a second dielectric constant that is different than the value of the first dielectric constant.

21 Claims, 5 Drawing Sheets

CIRCUIT BOARDS DEFINING REGIONS FOR CONTROLLING A DIELECTRIC CONSTANT OF A DIELECTRIC MATERIAL

BACKGROUND

Some embodiments described herein relate generally to reducing to dielectric constant of a dielectric material. More particularly, some embodiments described herein relate to printed circuit boards defining openings that reduce the effective dielectric constant of a printed circuit board substrate.

Some known electronic devices manufactured for high-speed signal transfer use printed circuit board (PCB) dielectric materials with specific characteristics. Often, such dielectric materials have a relatively high dielectric constant and can restrict the geometry of impedance-controlled strips (e.g., a transmission line such as a microstrip and/or stripline). For example, in some instances, it is desirable implement certain values of characteristic impedance of a differential pair and/or impedance-controlled strip. In such instances, the characteristic impedance of a transmission line can be mathematically described as:

$$Z_0 = \sqrt{\frac{L_0}{C_0}}$$

where $Z_0$ is the characteristic impedance of the transmission line, $L_0$ is the inductance per unit length of the transmission line, and $C_0$ is the capacitance per unit length of the transmission line. Furthermore, the capacitance per unit length of the transmission line for a given dielectric material can be mathematically described as:

$$C_0 = K\sqrt{\frac{W\varepsilon}{T}}$$

where K is a constant, W is the width of a transmission line (e.g., microstrip and/or stripline), $\varepsilon_r$ is the relative dielectric constant of a dielectric material, and T is the thickness of the dielectric material between the transmission line and a ground reference plane.

In some known instances, the width of the impedance-controlled strips cannot be further reduced to maintain acceptable propagation losses and manufacturability. To keep the same characteristic impedance with the wider impedance-controlled strips, the thickness of the dielectric material can be increased, resulting in an increase in overall thickness of the PCB, an increase in cost, a reduction in dielectric layers, limitations in drilling, and/or other unwanted effects. Furthermore, the relatively high dielectric constant of the dielectric material increases propagation delay along the impedance-controlled strip.

Thus, a need exists for improved apparatus and methods for reducing the dielectric constant of printed circuit board dielectric material.

SUMMARY

Apparatus and methods for reducing the dielectric constant of a PCB dielectric material are described herein. In some embodiments, a printed circuit board, configured to be coupled to electronic components, includes a first material portion and any number of second material portions. Each second material portion is sized and spaced apart from an adjacent second material portion such that electromagnetic waves associated with the operation of the electronic components are substantially not reflected. The first material portion defines a first dielectric constant and the second material portion defines a second dielectric constant that is different than the value of the first dielectric constant.

DETAILED DESCRIPTION

Figure 1:
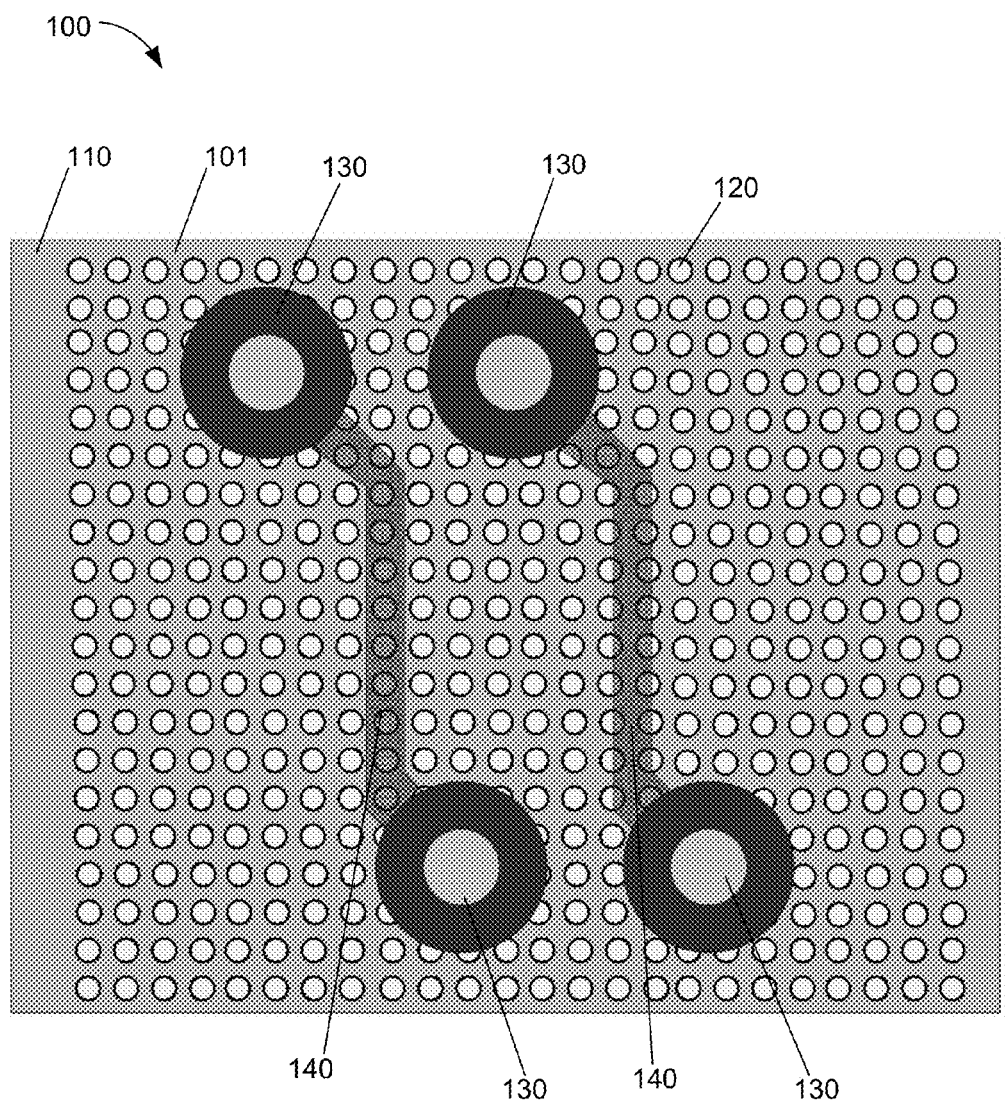
FIG. 1 is a top view schematic illustration of a portion of a printed circuit board, according to an embodiment.

Apparatus and methods for reducing the dielectric constant of a PCB dielectric material are described herein. In some embodiments, a printed circuit board, configured to be coupled to electronic components, includes a first material portion and any number of second material portions. Each second material portion is sized and spaced apart from an adjacent second material portion such that electromagnetic waves associated with the operation of the electronic components are substantially not reflected. The first material portion defines a first dielectric constant and the second material portion defines a second dielectric constant that is less than the value of the first dielectric constant.

In some embodiments, a printed circuit board, configured to be coupled to electronic components, includes a first material portion defining a first dielectric constant and any number of second material portions defining a second dielectric constant. Each second material portion is sized and spaced apart from an adjacent second material portion such that electromagnetic waves associated with the operation of the electronic components are substantially not reflected. The first material portion and the second material portions are configured such that the printed circuit board defines a substantially uniform effective dielectric constant between the value of the first dielectric constant and the second dielectric constant.

In some embodiments, a method for reducing a dielectric constant of a printed circuit board includes forming a printed circuit board with a first material portion and a second material portion. For example, in some embodiments, the second material portion can be air defined by holes drilled in a printed circuit board substrate. In some embodiments, each layer can be drilled independently. In other embodiments, the layers included in the printed circuit board are drilled concurrently. Each second material portion is sized and spaced apart from an adjacent second material portion such that electromagnetic waves associated with the operation of the electronic components are substantially not reflected. The first material portion defines a first dielectric constant and the second material portion defines a second dielectric constant that is less than the value of the first dielectric constant.

As used herein the term "data processing unit" refers to, for example, any computer, electronic switch, switch fabric, portion of a switch fabric, router, host device, data storage device, line card, backplane or the like used to process, transmit and/or convey electrical and/or optical signals. A data processing unit can include, for example, a component included within an electronic communications network. In some embodiments, for example, a data processing unit can be a component included within or forming a portion of a core switch fabric of a data center. In other embodiments, a data processing unit can be an access switch located at an edge of a data center, or a host or peripheral device (e.g., a server) coupled to the access device. For example, an access switch can be located on top of a chassis containing several host devices.

A printed circuit board used in high-speed signal transfer can include, for example, at least a conducting layer and at least an insulating layer. The conducting layer or layers can include transmission lines such as, for example, microstrips or striplines. The insulating layer or layers can include any suitable dielectric material. For example, in some embodiments, the insulating layer can be any suitable cotton paper and epoxy combination, woven glass and epoxy combination, matte glass and polyester combination, or the like. In some embodiments, a PCB can include dielectric materials from manufacturers such as, for example, GETEK, Nelco, Speedboard, and/or the like.

FIG. 1 is a top view schematic illustration of a portion of a printed circuit board 100, according to an embodiment. The printed circuit board (PCB) 100 can be any suitable PCB configured for use in high-speed signal transfer. For example, in some embodiments, the PCB 100 can be included in a data processing unit, such as those described above. The PCB 100 includes a PCB substrate 101, electronic components (not shown), vias 130, and transmission lines 140.

The vias 130 can be mechanically or laser drilled holes within the PCB substrate 101. The vias 130 are configured to facilitate an electrical and/or thermal connection of a set of conductors on a first side of the PCB substrate 101 to a set of conductors on a second side of the PCB substrate 101. For example, in some embodiments, a set of walls defining the vias 130 are plated in copper and electrically connect a first layer and a second layer of the PCB 100. The electronic components can be physically and electrically connected to the PCB substrate 101 and/or transmission lines 140 using any suitable connection. For example, in some embodiments, the electronic components can be disposed on or about the vias 130 on a first side of the PCB substrate 101. In such embodiments, the electrical components can include pins that can be inserted into the vias 130 and soldered into place to define a physical and electrical connection with the transmission lines 140 and/or the PCB substrate 101. Therefore, in some embodiments, the PCB 100 can include a first surface that can include electrical components and a second surface that can include conductors (e.g., transmission lines 140). In some embodiments, this arrangement can allow for a more compact design of the PCB 100. The electronic components can be any suitable electronic components. For example, the electronic components can be any electronic component included in a data processing unit, such as, for example, those described above.

The transmission lines 140 can be any suitable transmission line. The transmission lines 140 can be configured to carry and/or transmit a current with a relatively high frequency, such as, for example, in high-speed signal transmission. In such embodiments, it can be desirable to account for the characteristics of the electromagnetic wave carried on the transmission lines 140 such that reflections and/or power loss is minimized. In some embodiments, the transmission lines 140 can define differential pairs to reduce signal noise and or electromagnetic interference. In other embodiments, the transmission lines 140 can define single-ended links. In some embodiments, the transmission lines 140 can further define a characteristic impedance configured to match the impedance of a set of electrical components. For example, in some embodiments, the transmission lines 140 can define a characteristic impedance of 100Ω.

The PCB substrate 101 is configured to form a dielectric layer of the PCB 100. As shown in FIG. 1, the PCB substrate 101 includes a first material portion 110 defining a first dielectric constant and a second material portion 120 defining a second dielectric constant. In this manner, the dielectric constant of the first material portion 110 and the dielectric constant of the second material portion 120 collectively define the effective dielectric constant of the PCB 100. The first material portion 110 can be any suitable dielectric material. For example, in some embodiments, the first material portion 110 can be formed of FR-4 with a dielectric constant of approximately 4.3. In other embodiments, the first material portion 110 can be any dielectric material, such as, for example, those described above and can define any suitable dielectric constant. For example, in some embodiments, the dielectric constant of the first material portion 110 can be between 3.7 and 4.9.

The second material portions 120 can be any suitable dielectric material and define any suitable dielectric constant. In some embodiments, the dielectric constant of the second material portion 120 can be less than the dielectric constant of the first material portion 110, thereby reducing the effective dielectric constant of the PCB 100. In other embodiments, the dielectric constant of the second material portion 120 can be greater than the dielectric constant of the first material portion 110, thereby increasing the effective dielectric constant of the PCB 100. For example, in some embodiments, the second material portions 120 can be air. Expanding further, as shown in FIG. 1, the first material portion 110 can define any number of holes. In this manner, the second material portions 120 (e.g., air) are defined by the void between the walls defining the holes in the first material portion 110. The second material portions 120, defined by the walls of the first material portion 110, can have any suitable cross-sectional shape. For example, in some embodiments, at least one of the second material portions 120 can have a substantially circular cross-sectional shape across a plane substantially normal to the center line of the hole in the first material portion 110 that defines the second material portion 120. In other embodiments, at least one of the second material portions 120 can have a substantially non-circular cross-sectional shape (e.g., rectangular, oval, triangular or the like) across a plane substantially normal to the center line of the hole in the first material portion 110 that defines the second material portion 120. In yet other embodiments, a first hole defining a second material portion 120 can have a first cross-sectional shape and a second hole defining a second material portion 120 can have a second cross-sectional shape different from the first cross-sectional shape.

Furthermore, the second material portions 120 can be any suitable size and can be disposed at any suitable distance from an adjacent second material portion 120. For example, the second material portions 120 define a lateral size no greater than one tenth of one quarter of a wavelength associated with an operational frequency of the electronic components. Similarly, a first hole defining a second material portion 120 and an adjacent second hole defining a second material portion 120 can be disposed, for example, at a distance no greater than one tenth of one quarter of the wavelength associated with the operational frequency of the electronic components. Thus, the arrangement of the second material portions 120 relative to the first material portion 110 is such that heterogeneity (e.g., granularity) of the combined dielectric substance (e.g., the PCB 100) does not result in disturbances or reflections of an electromagnetic wave associated with the operation of the electronic components: any effects due to the combined non-homogenous structure are substantially not propagated or reduced sufficient to avoid a negative impact on the performance of the electronic components.

As described above, the second material portion 120 defines the second dielectric constant that is substantially different from the first dielectric constant defined by the first material portion 110. For example, in some embodiments, the second material portion 120 is air and defines the second dielectric constant that is substantially equal to 1. In such embodiments, the second dielectric constant is substantially less than the first dielectric constant defined by the first material portion 110. Furthermore, the arrangement of the first material portion 110 and the second material portion 120 is such that the PCB substrate 101 defines a substantially uniform effective dielectric constant that is less than the first dielectric constant of the first material portion 110 and greater than the second dielectric constant of the second material portion 120. Similarly stated, the presence of the second material portion 120 substantially reduces the effective dielectric constant of the PCB substrate 101.

Figure 2:
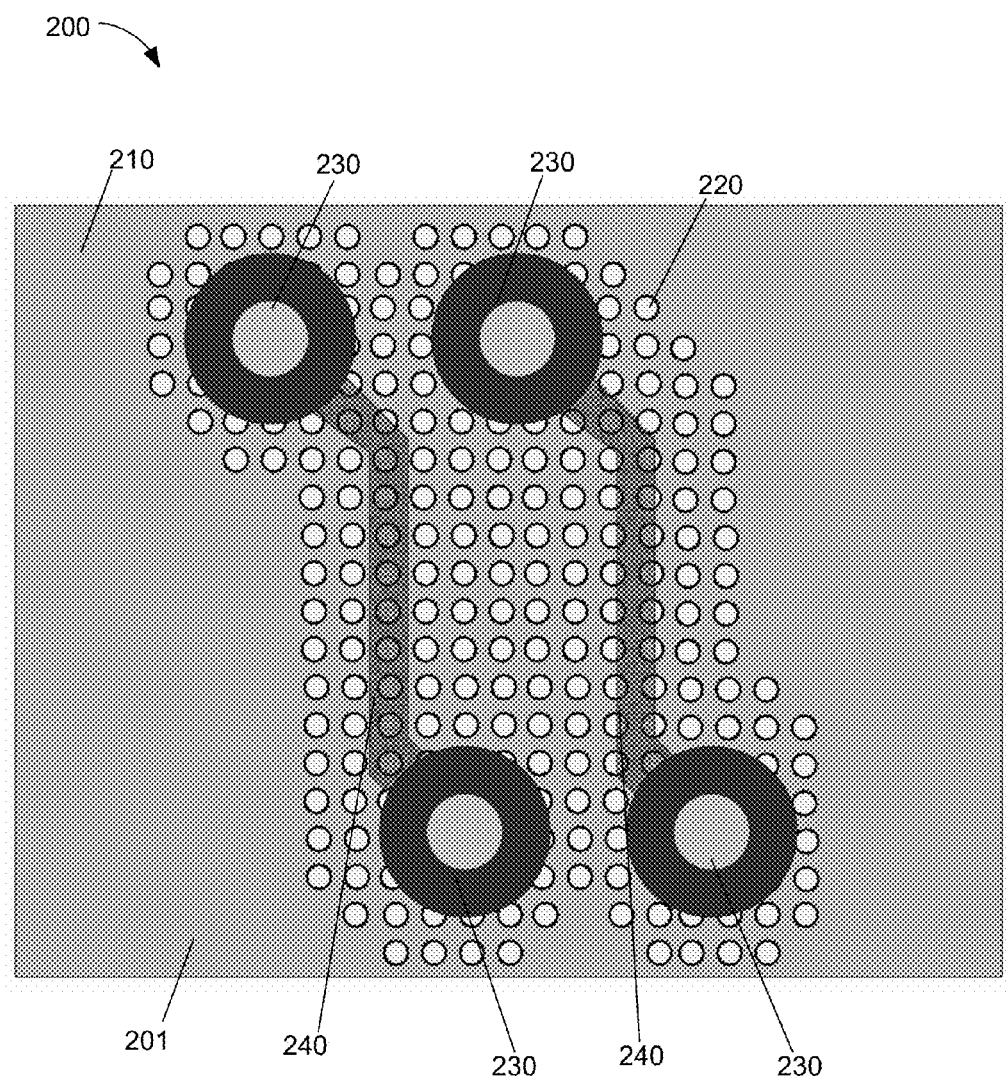
FIG. 2 is a top view schematic illustration of a portion of a printed circuit board, according to an embodiment.

While the second material portions 120 is shown in FIG. 1 as being substantially disposed across the entire area of the first material portion 110, in some embodiments, second material portions can be selectively disposed with respect to a first material portion, electronic components, and/or transmission lines. For example, as shown in FIG. 2, a printed circuit board 200 includes a PCB substrate 201, electronic components (not shown), vias 230, and transmission lines 240. In some embodiments, the electronic components, the vias 230, and the transmission lines 240 can be substantially similar to the electronic components, the vias 130, and the transmission lines 140 described above with respect to FIG. 1. In this manner, the electronic components, the vias 230, and the transmission lines 140 are not described in further detail.

The PCB substrate 201 includes a first material portion 210 and a second material portion 220. In some embodiments, the first material portion 210 and the second material portion 220 can be substantially similar in function to the first material portion 110 and the second material portion 120 described above with respect to FIG. 1. For example, in some embodiments, the second material portion 220 can be air. The first material portion 210 and the second material portion 220 differ, however, in the arrangement of the second material portions 220 relative to the first material portion 210. For example, as shown in FIG. 2, the second material portions 220 are disposed within a specific area of the PCB substrate 201 that includes the electronic components (not shown) and the transmission lines 240. Similarly stated, the second material portions 220 can be selectively disposed with respect to the first material portion 210 such as to lower the effective dielectric constant of the specific area of the PCB substrate 201 where the electronic components and the transmission lines 240 are disposed.

In some embodiments such as that shown in FIG. 2, the selective arrangement of the second material portions 220 with respect to PCB substrate 201, the electronic components, the vias 230, and/or the transmission lines 240 can be such that the cost of the PCB 200 is reduced relative to other embodiments and/or known PCBs. For example, in such embodiments, the manufacturing cost of the PCB 200 can be reduced by limiting the amount of drilling operations and/or production time of the PCB 200. In some embodiments, the PCB 200 can include electronic components not dependent on the dielectric constant disposed on a region of the PCB 200 with the first material portion 210 and without the second material portion 220 (not shown in FIG. 2). For example, in some embodiments, the PCB 200 can include the electronic components configured for high-speed signal transfer and a second set of the electronic components not configured for high-speed signal transfer. In this manner, the operational frequency of the electronic components is such that it is desirable to account for the effects of the dielectric material of the PCB substrate 101 on the signal transfer. Conversely, the operational frequency of the second set of electronic components, disposed on the region of the PCB 200 with the first material portion 210 and without the second material portion 220, is such that the dielectric material of the PCB substrate 101 does not impact the signal transfer. Thus, the PCB 200 can be used for both high-speed and non-high-speed signal transfer while maintaining a relatively low cost.

Figure 3:
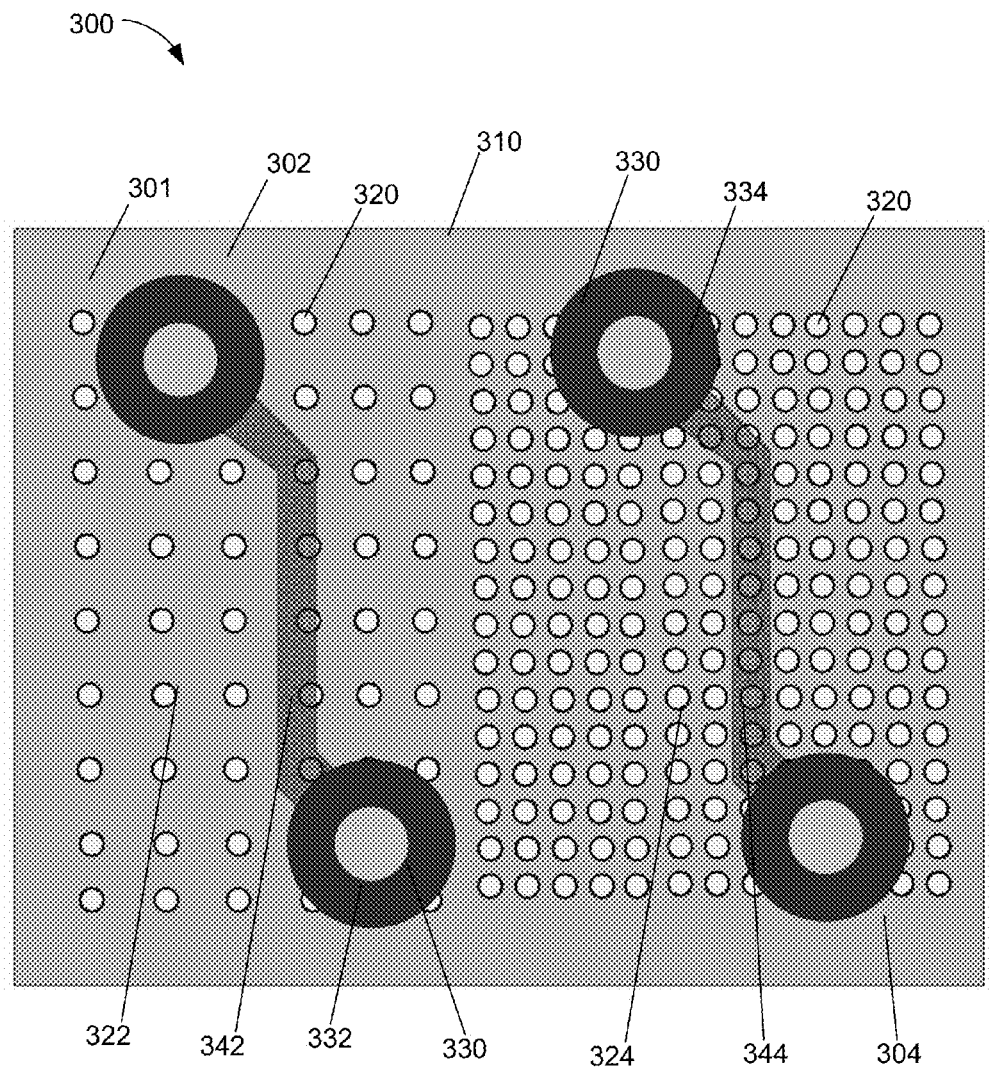
FIG. 3 is a top view schematic illustration of a portion of a printed circuit board, according to an embodiment.

While the second material portions 120 (FIG. 1) and 220 (FIG. 2) are shown as being substantially uniformly disposed on or within the PCB substrate 101 and 201, respectively, in some embodiments, a printed circuit board can include any number of second material portions selectively disposed on or within a PCB substrate. For example, as shown in FIG. 3, a printed circuit board 300 includes a PCB substrate 301, electronic components (not shown), a first set of vias 332, a second set of vias 334, a first set of transmission lines 342, and a second set of transmission lines 344.

The electronic components can be any suitable electronics and can define a given impedance and a given operational frequency. More specifically, a first set of electronic components (not shown) can be disposed on or within a first region 302 of the PCB substrate 301 and define a first operational frequency and a first impedance. Additionally, a second set of electronic components (not shown) can be disposed on or within a second region 304 of the PCB substrate 301 and define a second operational frequency and a second impedance (e.g., different from the first operational frequency and the first impedance). The first transmission line 342 is disposed on or within the first region 302 of the PCB substrate 301 and can define a first characteristic impedance configured to match the impedance of the electronic components disposed on or within the first region 302. In a similar manner, the second transmission line 344 is disposed on or within the second region 304 of the PCB substrate 301 and can define a second characteristic impedance.

The PCB substrate 301 further includes a first material portion 310 and a second material portion 320. In some embodiments, the first material portion 310 and the second material portion 320 can be substantially similar in function to the first material portion 110 and the second material portion 120 described above with respect to FIG. 1. For example, in some embodiments, the second material portion 320 can be air. The first material portion 310 and the second material portion 320 differ, however, in the arrangement of the second material portions 320 relative to the first material portion 310. For example, as shown in FIG. 3, the first region 302 of the PCB substrate 301 includes a first subset 322 of second material portions 320; the second region 302 of the PCB substrate 301 includes a second subset 324 of second material portions 320.

The second material portions 320 can be disposed on or within the first region 302 and/or the second region 304 of the PCB substrate 301 in any suitable manner. For example, the first subset 322 of second material portions 320 is disposed on or within the first region 302 at a first distance. Similarly stated, a first hole (e.g., within the first material portion 310 included in the first region 302) defining a second material portion 320 is disposed at the first distance from an adjacent second hole defining a second material portion 320 within the first region 302. The second subset 324 of the second material portions 320 is disposed on or within the second region 304 at a second distance. Similarly stated, a first hole (e.g., within the first material portion 310 included in the second region 304) defining a second material portion 320 is disposed at the second distance from an adjacent second hole defining a second material portion 320 within the second region.

As described above with respect to FIG. 1, the first distance and the second distance are configured to be no greater than one tenth of one quarter of a wavelength of the operational frequency associated with the first set of electronic components and the second set of electronic components, respectively. In this manner, the arrangement of the first subset 322 of the second material portions 320 and the second subset 324 of the second material portions 320 are disposed such that reflections of an electromagnetic wave resulting from the heterogeneity of the dielectric material (e.g., the PCB 300) are substantially not propagated (or reduced sufficient to avoid a negative impact on the performance of the electronic components).

In addition, the first subset 322 of the second material portions 320 are disposed such that the first region 302 of the PCB substrate 301 defines a first effective dielectric constant, and the second subset 324 of the second material portions 320 are disposed such that the second region 304 of the PCB substrate 301 defines a second effective dielectric constant. For example, in some embodiments, the first region 302 of the PCB substrate 301 defines the first effective dielectric constant such that the first transmission line 342 defines the first characteristic impedance configured to match the impedance of the first set of electronic components. Similarly, the second region 304 of the PCB substrate 301 defines the second effective dielectric constant such that the second transmission line 344 defines the second characteristic impedance configured to match the impedance of the second set of electronic components. In this manner, the PCB 300 can be configured to facilitate the operation of any number of electronic components with transmission lines defining a similar or dissimilar characteristic impedance.

Figure 4:
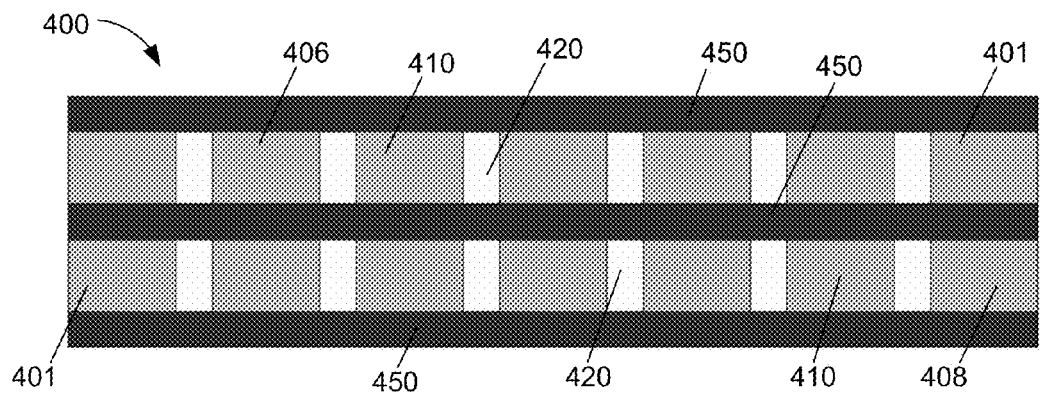
FIG. 4 is a cross-sectional schematic illustration of a portion of a printed circuit board, according to an embodiment.

Referring now to FIG. 4, a PCB 400 can include a first layer 406 and a second layer 408. The PCB 400 further includes a PCB substrate 401 with a first material portion 410 and a second material portion 420 and conducting strips 450. The conducting strips 450 can be, for example, transmission lines (e.g., microstrips or striplines) and/or ground planes. The first material portion 410 and the second material portion 420 of the PCB substrate 401 can be in any configuration. For example, in some embodiments, the first material portion 410 and the second material portion 420 can be substantially similar to the first material portion 110 and the second material portion 120 of the PCB substrate 101 described above with respect to FIG. 1. Thus, the second material portion 420 can be air and be defined by a set of walls defining a set of holes within the first material portion 410.

In some embodiments, at least one of the second material portions 420 can have a substantially circular cross-sectional shape across a plane substantially normal to the center line of the hole in the first material portion 410 that defines the second material portion 420. In other embodiments, at least one of the second material portions 420 can have a substantially non-circular cross-sectional shape (e.g., rectangular, oval, triangular or the like) across the plane substantially normal to the center line of the hole in the first material portion 410 that defines the second material portion 420. In yet other embodiments, a first hole defining a second material portion 420 can have a first cross-sectional shape and a second hole defining a second material portion 420 can have a second cross-sectional shape different from the first cross-sectional shape.

Additionally, the second material portions 420 can be any suitable size and can be disposed at any suitable distance from an adjacent second material portion 420. More specifically, the second material portions 420 define a lateral size no greater than one tenth of one quarter of a wavelength associated with an operational frequency of an electromagnetic wave configured to travel along the conducting strips 450. Similarly, a first hole defining a second material portion 420 and an adjacent second hole defining a second material portion 420 are disposed at a distance no greater than one tenth of one quarter of the wavelength associated with the operational frequency of the electromagnetic wave. Thus, the arrangement of the second material portions 420 is such that reflections of the electromagnetic wave associated with the operation of electronic components (e.g., differential pairs not shown in FIG. 4) are not propagated.

The first material portion 410 and the second material portion 420 can function similarly to the first material portion 110 and the second material portion 120, described above in FIG. 1, to reduce the effective dielectric constant of the PCB substrate 401. Expanding further, the effective dielectric constant of the PCB substrate 401 included in the first layer 406 and the second layer 408 is reduced such that the value of the effective dielectric constant is between the value of the dielectric constant of the first material portion 410 and the dielectric constant of the second material portion 420. Therefore, the reduction of the effective dielectric constant of the PCB substrate 401 can be such that the PCB 400 can include multiple layers that would otherwise be limited by the thickness of the PCB substrate 410 (e.g., as governed by the equation described above).

Figure 5:
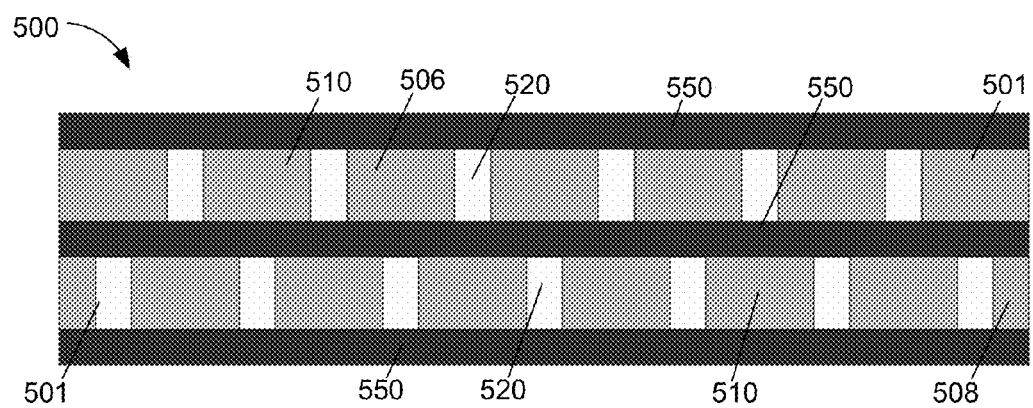
FIG. 5 is a cross-sectional schematic illustration of a portion of a printed circuit board, according to an embodiment.

While the second material portions 420 included in the first layer 406 are shown substantially in line (e.g., adjacent or defining a similar centerline) to the second material portions 420 included in the second layer 408, in some embodiments, a first layer and a second layer of a PCB can include second material portions disposed at any suitable location. For example, as shown in FIG. 5, a printed circuit board 500 includes a PCB substrate 501 and conducting strips 550 that define a first layer 506 and a second layer 508 of the PCB 500. The PCB substrate 501 includes a first material portion 510 and a second material portion 520. The PCB substrate 501 and the conducting strips 550 can be substantially similar to the PCB substrate 401 and the conducting strips 450 included in the PCB 400 described above with respect to FIG. 4.

As shown in FIG. 5, the first layer 506 is configured such that the second material portions 520 are in a first position relative to the PCB 500 and the second layer 508 is configured such that the second material portions 520 are in a second position relative to the PCB 500. The offset of the second material portions 520 included in the second layer 508 relative to the second material portions 520 included in the first layer 506 is such that the uniformity of the effective dielectric constant of the PCB 500 is increased without increasing the number or density of the second material portions 520. Thus, in some embodiments, the cost of the PCB can be reduced by reducing the number of second material portions 520 while achieving the desired effective dielectric constant.

Figure 6:
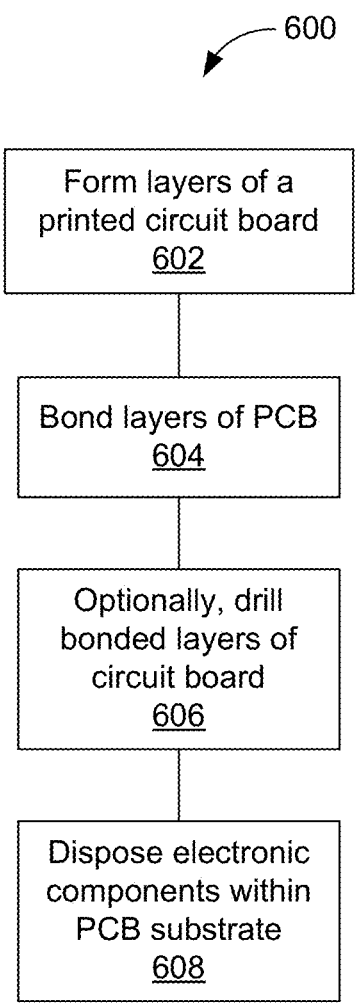
FIG. 6 is a flowchart illustrating a method for forming a printed circuit board, according to an embodiment.

FIG. 6 is a flowchart illustrating a method of forming a printed circuit board with a dielectric material defining a reduced effective dielectric constant. Method 600 includes forming layers of a PCB substrate, at 602. The PCB substrate (e.g., dielectric material) can be any of the substrates discussed herein. For example, in some embodiments, the PCB substrate is formed from a woven glass and epoxy combination, such as, FR-4. In some embodiments, the method 600 can include forming the PCB substrate such that the PCB substrate includes a first material portion and a second material portion. For example, in some embodiments, the PCB substrate can be formed from a woven glass and epoxy combination and be configured to include any number of air pockets, thereby defining the second material portion. In other embodiments, the PCB substrate can be formed from any suitable substrate material and can be drilled such that the voids defined by the drilled holes in the PCB substrate define the second material portion. In such embodiments, the PCB substrate can be laser drilled such that the lateral size of the drilled holes is no greater than one tenth of one quarter of a wavelength of an electromagnetic wave configured to travel along a transmission line. Similarly, in such embodiments, a laser drilled hole can be disposed at a distance no greater than one tenth of one quarter of the wavelength from an adjacent laser drilled hole. In still other embodiments, the PCB substrate layers can be formed similarly to other known methods and holes drilled as described in further detail herein.

With the PCB substrate layers formed, the PCB substrate layers are bonded together, at 604. In some embodiments, the PCB substrate layers are bonded similarly to known methods. In other embodiments that include laser drilled holes for example, the holes can be filled with any suitable second material prior to bonding. For example, in some embodiments, the second material defines a dielectric constant that is substantially less than the dielectric constant defined by the PCB substrate and greater than the dielectric constant of air. In such embodiments, the effective dielectric constant of the PCB substrate can be reduced to a desired level (e.g., greater than if the second material portion includes air). For example, in some embodiments, the desired effective dielectric constant of a PCB substrate is such that the spacing between second material portions including air is too large (e.g., approaching or greater than one tenth of one quarter of a wavelength of a electromagnetic wave configured to travel on a given transmission line). In such embodiments, the use of a second material portion with a dielectric constant greater than the dielectric constant of air can allow for the desired spacing between second material portions (e.g., less than one tenth of one quarter of the wavelength).

In some embodiments, the holes can be filled with a second material that defines a dielectric constant that is substantially greater than the dielectric constant defined by the PCB substrate. In such embodiments, the second material portion can increase the effective dielectric constant of the PCB to a desired level such that the PCB can be suitable for a given electronic component.

In some embodiments, the second material is configured to react with the bonding material such that the second material is dissolved by the bonding material to leave a void in the space defined by the laser drilled hole. In other embodiments, the second material can be configured to evaporate during a curing process. In still other embodiments, the laser drilled holes are not filled with a second material and a substantially non-viscous bonding material is used such that the bonding material does not fill the laser drilled holes. In this manner, the laser drilled holes are substantially open after the bonding process. Thus, the second material portions in such embodiments are air.

As described above, in some embodiments, the PCB substrate layers are formed similarly to known methods. In such embodiments, the method 600 optionally includes laser drilling the bonded layers of the PCB, at 606. With the PCB substrate including the first material portion and the second material portion and with the layers of the PCB bonded together, the PCB substrate can define a reduced effective dielectric constant. The value of the effective dielectric constant of the PCB substrate (e.g., including the first material portion and the second material portion) is between the value of the dielectric constant of the PCB substrate (e.g., the first material) and the value of the dielectric constant of the second material. Furthermore, the first material portion and the second material portion are configured such that the PCB substrate defines a substantially uniform effective dielectric constant.

With the PCB substrate including the first material portion and the second material portion and with the layers of the PCB bonded together, the method 600 includes disposing any suitable electronic components on or within the PCB substrate, at 608. In some embodiments, the electronic components include transmission lines, differential pairs, and/or single-ended links, as described herein. In such embodiments, the effective dielectric constant of the PCB substrate (e.g., including the first material portion and the second material portion) is such that the PCB substrate facilitates a known characteristic impedance defined by the transmission lines disposed on or within the substrate. In this manner, the PCB can be configured for high-speed signal transfer.

While various embodiments have been described above, it should be understood that they have been presented by way of example only, and not limitation. Where methods and/or schematics described above indicate certain events and/or patterns occurring in certain order, the ordering of certain events and/or patterns may be modified. While the embodiments have been particularly shown and described, it will be understood that various changes in form and details may be made.

Although the second material portions 520, shown and described above with reference to FIG. 5, define a center line that is substantially perpendicular to the PCB 500, in other embodiments, at least one second material portion 520 can define a center line that is non-perpendicular to the PCB 500. In some embodiments, the printed circuit board 500 can include a set of second material portions 520 that define a first angle relative to the PCB 500 and at least a second set of second material portions 520 that define a second angle relative to the PCB 500. For example, in some embodiments, the printed circuit board 500 can include a first set of second material portions defining a center line offset from the PCB 500 by a first angle (e.g., an angle of +30 degrees) and a second set of second material portions defining a center line offset from the PCB 500 by a second angle different than the first angle (e.g., an angle of −30 degrees). Although the second material portions 520 are shown as having a substantially constant size along their center line, in other embodiments, at least one second material portion can have a size that varies spatially along its center line.

While embodiments described herein describe a second material portion defining a dielectric constant substantially less than a dielectric constant defined by a first material portion, in some embodiments, the dielectric constant of the second material portion can be substantially greater than the dielectric constant of the first material portion. For example, in some embodiments, the first material portion 110, shown above with reference to FIG. 1, can include holes that are substantially filled with a second dielectric material with a greater dielectric constant (e.g., the holes do not define a void, thus, the second dielectric material is a dielectric material other than air).

Although various embodiments have been described as having particular features and/or combinations of components, other embodiments are possible having a combination of any features and/or components from any of embodiments as discussed above.

What is claimed is:

1. An apparatus, comprising:
a printed circuit board (PCB) substrate configured to be coupled to electronic components,
the PCB substrate having a first material portion and a plurality of second material portions, each second material portion from the plurality of second material portions being sized and spaced from adjacent second material portions from the plurality of second material portions such that electromagnetic waves associated with operation of the electronic components are substantially not reflected by the plurality of second material portions,
the first material portion having a dielectric constant different than a dielectric constant of a second material portion from the plurality of second material portions, the dielectric constant of the second material portion from the plurality of second material portions being no greater than one-half of the dielectric constant of the first material portion.

2. The apparatus of claim 1, wherein the electronic components are configured to operate at a frequency, each second material portion from the plurality of second material portions having a lateral size substantially no greater than one tenth of a quarter of a wavelength associated with the frequency.

3. The apparatus of claim 1, wherein the electronic components are configured to operate at a frequency, each second material portion from the plurality of second material portions being spaced from adjacent second material portions from the plurality of second material portions by a distance substantially no greater than one tenth of a quarter of a wavelength associated with the frequency.

4. The apparatus of claim 1, wherein:
the PCB substrate has a first region and second region mutually exclusive from the first region, the plurality of second material portions including a first subset of second material portions disposed within the first region and a second subset of second material portions disposed within the second region,
each second material portion from the first subset of second material portions being spaced from adjacent second material portions from the first subset of second material portions by a first distance,
each second material portion from the second subset of second material portions being spaced from adjacent second material portions from the second subset of second material portions by a second distance different from the first distance.

5. The apparatus of claim 1, wherein:
the PCB substrate has a first region and second region mutually exclusive from the first region, the plurality of second material portions including a first subset of second material portions disposed within the first region and a second subset of second material portions disposed within the second region,
each second material portion from the first subset of second material portions being spaced from adjacent second material portions from the first subset of second material portions by a first distance,
each second material portion from the second subset of second material portions being spaced from adjacent second material portions from the second subset of second material portions by a second distance different from the first distance,
the electronic components including a differential impedance connection pair including a first connection and a second connection, the first connection being disposed within the first region, the second connection being disposed within the second region.

6. The apparatus of claim 1, wherein each second material portion from the plurality of second material portions is air, the PCB substrate having an effective substantially uniform dielectric constant between the dielectric of air and the dielectric of the first material portion.

7. The apparatus of claim 1, wherein each second material portion from the plurality of second material portions has a dielectric constant different than the dielectric constant of the first material portion, the PCB substrate having an effective substantially uniform dielectric constant between the dielectric of the second material portions and the dielectric of the first material portion.

8. An apparatus, comprising:
a printed circuit board (PCB) substrate configured to be coupled to electronic components,
the PCB substrate having a first material portion and a plurality of second material portions, each second material portion from the plurality of second material portions being sized and spaced from adjacent second material portions from the plurality of second material portions such that electromagnetic waves associated with operation of the electronic components propagate within the PCB substrate having an effective substantially uniform dielectric constant between a dielectric constant of the first material portion and a dielectric constant of a second material portion from the plurality of second material portions.

9. The apparatus of claim 8, wherein:
each second material portion from the plurality of second material portions is sized and spaced from adjacent second material portions from the plurality of second material portions such that electromagnetic waves associated with operation of the electronic components are substantially not reflected by the plurality of second material portions,
the first material portion has a dielectric constant different than a dielectric constant of a second material portion from the plurality of second material portions.

10. The apparatus of claim 8, wherein:
the electronic components are configured to operate at a frequency,
each second material portion from the plurality of second material portions having a lateral size substantially no greater than one tenth of a quarter of a wavelength associated with the frequency,
each second material portion from the plurality of second material portions being spaced from adjacent second material portions from the plurality of second material portions by a distance substantially no greater than one tenth of a quarter of a wavelength associated with the frequency.

11. The apparatus of claim 8, wherein:
the PCB substrate has a first region and second region mutually exclusive from the first region, the plurality of second material portions including a first subset of second material portions disposed within the first region and a second subset of second material portions disposed within the second region,
each second material portion from the first subset of second material portions being spaced from adjacent second material portions from the first subset of second material portions by a first distance,
each second material portion from the second subset of second material portions being spaced from adjacent second material portions from the second subset of second material portions by a second distance different from the first distance.

12. The apparatus of claim 8, wherein:
the PCB substrate has a first region and second region mutually exclusive from the first region, the plurality of second material portions including a first subset of second material portions disposed within the first region and a second subset of second material portions disposed within the second region,
each second material portion from the first subset of second material portions being spaced from adjacent second material portions from the first subset of second material portions by a first distance,
each second material portion from the second subset of second material portions being spaced from adjacent second material portions from the second subset of second material portions by a second distance different from the first distance,
the electronic components including a differential impedance connection pair including a first connection and a second connection, the first connection being disposed within the first region, the second connection being disposed within the second region.

13. The apparatus of claim 8, wherein each second material portion from the plurality of second material portions is air, the PCB substrate having an effective substantially uniform dielectric constant between the dielectric of air and the dielectric of the first material portion.

14. The apparatus of claim 8, wherein each second material portion from the plurality of second material portions has a dielectric constant different than the dielectric constant of the first material portion, the PCB substrate having an effective substantially uniform dielectric constant between the dielectric of the second material portions and the dielectric of the first material portion.

15. The apparatus of claim 8, wherein the dielectric constant of the second material from the plurality of second material portions being no greater than one-half of the dielectric constant of the first portion.

16. A method, comprising:
forming a printed circuit board (PCB) substrate having a first material portion and a plurality of second material portions, the PCB substrate having an effective substantially uniform dielectric constant associated with the dielectric constant of the first material portion and the dielectric constant of each second material portion from the plurality of second material portions; and
disposing electronic components within the PCB substrate,
each second material portion from the plurality of second material portions being sized and spaced from adjacent second material portions from the plurality of second material portions such that electromagnetic waves associated with operation of the electronic components are substantially not reflected by the plurality of second material portions.

17. The method of claim 16, wherein the PCB board includes a plurality of layers, the forming includes:
bonding the plurality of layers together; and
after the bonding, drilling a plurality of holes through the plurality of layers to define the plurality of second material portions such that each hole from the plurality of holes is offset from each electronic component.

18. The method of claim 16, wherein the PCB board includes a plurality of layers, the forming includes:
drilling a plurality of holes through each layer from the plurality of layers;
after the drilling, filling each hole from the plurality of holes for each layer from the plurality of layers with a material to define the plurality of second material portions; and
after the filling, bonding the plurality of layers together.

19. The method of claim 16, wherein the forming includes forming the PCB board with a plurality of air pockets disposed within the PCB board, the plurality of air pockets defining the plurality of second material portions.

20. The method of claim 16, wherein:
the electronic components are configured to operate at a frequency,
each second material portion from the plurality of second material portions having a lateral size substantially no greater than one tenth of a quarter of a wavelength associated with the frequency, and
each second material portion from the plurality of second material portions being spaced from adjacent second material portions from the plurality of second material portions by a distance substantially no greater than one tenth of a quarter of a wavelength associated with the frequency.

21. The method of claim 16, wherein the dielectric constant of the first material portion differing from the dielectric constant of each second material portion from the plurality of second material portions by no less than 2.7.

* * * * *